United States Patent
Isomura et al.

(10) Patent No.: US 12,142,701 B2
(45) Date of Patent: Nov. 12, 2024

(54) LIGHT RECEIVING DEVICE

(71) Applicant: Dexerials Corporation, Tochigi (JP)

(72) Inventors: Takatomo Isomura, Tochigi (JP); Etsuji Omura, Tochigi (JP)

(73) Assignee: Dexerials Corporation, Tochigi (JP)

( * ) Notice: Subject to any disclaimer, the term of this patent is extended or adjusted under 35 U.S.C. 154(b) by 0 days.

(21) Appl. No.: 18/518,407

(22) Filed: Nov. 22, 2023

(65) Prior Publication Data
US 2024/0213383 A1 Jun. 27, 2024

Related U.S. Application Data

(63) Continuation of application No. PCT/JP2022/048201, filed on Dec. 27, 2022.

(51) Int. Cl.
*H01L 31/0232* (2014.01)
*H01L 31/028* (2006.01)
*H01L 31/0304* (2006.01)
*H01L 31/0328* (2006.01)

(52) U.S. Cl.
CPC ...... *H01L 31/02327* (2013.01); *H01L 31/028* (2013.01); *H01L 31/0304* (2013.01); *H01L 31/0328* (2013.01)

(58) Field of Classification Search
CPC ............ H01L 31/02327; H01L 31/028; H01L 31/0304; H01L 31/0328
See application file for complete search history.

(56) References Cited

U.S. PATENT DOCUMENTS

2002/0135035 A1* 9/2002 Yamaguchi ......... H01L 31/1035
257/E31.059
2008/0130138 A1* 6/2008 Katoh .................. G02B 5/1814
359/728

FOREIGN PATENT DOCUMENTS

| JP | H05136446 | 6/1993 |
| JP | 2008008678 | 1/2008 |
| JP | 2013201368 | 10/2013 |
| JP | 2017103435 | 6/2017 |
| WO | 2019150533 | 8/2019 |

OTHER PUBLICATIONS

N. Murata, "Adhesives for optical devices," 1998 Proceedings. 48th Electronic Components and Technology Conference (Cat. No .98CH36206), Seattle, WA, USA, 1998, pp. 1178-1185, doi: 10.1109/ECTC.1998.678869. (Year: 1998).*

* cited by examiner

*Primary Examiner* — Sitaramarao S Yechuri
(74) *Attorney, Agent, or Firm* — JCIPRNET

(57) ABSTRACT

A semiconductor light receiving element in which a photodiode is formed on the main surface side of a first semiconductor substrate, and a cone ave mirror reflecting an incident light toward the light receiving element. The concave mirror comprises a flat first surface of the second semiconductor substrate that is transparent to the incident light, a convex surface formed in a convex shape toward the side opposite to the first surface on the second surface side opposite to the first surface, and a reflective film formed on the convex surface, and the incident light entering from the first surfaceside is reflected by the reflective film to a condensing positionnear the first surface, and the light receiving element was fixed to the first surface so as to overlap the light focusing position of the concave mirror.

4 Claims, 3 Drawing Sheets

LIGHT RECEIVING DEVICE

CROSS-REFERENCE TO RELATED APPLICATION

This application is a continuation of the International PCT application serial no. PCT/JP2022/048201, filed on Dec. 27, 2022. The entirety of the above-mentioned patent application is hereby incorporated by reference herein and made a part of this specification.

TECHNICAL FIELD

The present invention relates to a light-receiving device for optical communications that includes a semiconductor light receiving element that converts an incident optical signal into an electrical signal and outputs the electrical signal, and more particularly, the present invention relates to a light receiving device that includes a concave mirror that reflects incident light so as to focus it toward the semiconductor light receiving element.

BACKGROUND ART

In the field of optical communications, development is underway to increase transmission speeds in order to cope with the rapid increase in communication traffic. In optical communication, an optical signal is transmitted from the transmitting side via an optical fiber cable or the like, and on the receiving side, the optical signal received by a semiconductor light receiving element is converted into an electrical signal.

Increasing the transmission speed on the receiving side is achieved by increasing the response speed of the semiconductor light receiving element. For this purpose, it is necessary to improve the upper limit of the response speed defined by the element capacitance and element resistance. Similarly, higher speeds are also required in the fields of optical intersatellite communication and optical space communication, which utilize collimated light for communication without going through an optical fiber cable.

The element capacitance of a semiconductor light receiving element becomes smaller as the area of the photodiode, that is, the diameter of the light absorption layer that converts light into electricity (charge) becomes smaller. For example, when realizing a semiconductor light receiving device with a response frequency band of about 5 GHz the device capacitance will be sufficiently small if the diameter of the light absorption layer is set to about 100 µm.

On the other hand, as the diameter of the light absorption layer becomes smaller, the area of the photodiode becomes smaller, so the amount of light received decreases and the sensitivity decreases. For this reason, semiconductor light receiving elements are known that can condense transmitted light and make it enter a light absorption layer.

For example, Patent Document #1 discloses a semiconductor light receiving element in which the front side of a semiconductor substrate is formed into a convex lens shape, a photodiode is formed in the center of the convex lens portion, and a plane mirror is formed on the back side. This semiconductor light receiving element condenses collimated light incident from the surface side of a convex lens and reflects it toward a photodiode with the plane mirror.

Further, for example, Patent Document #2 discloses a semiconductor light receiving element in which a photodiode is formed on the front side of a semiconductor substrate and a concave mirror is formed on the back side. This semiconductor light receiving element reflects collimated light incident from the front side using a concave mirror so as to condense the light toward the photodiode.

In Patent Documents #1 and #2, light received by a convex lens or concave mirror having a larger area than the photodiode is collected and made incident on the photodiode. In this case, since the light is focused over a distance corresponding to the thickness of the semiconductor substrate on which the photodiode is formed or a distance that light travels back and forth, the diameter of the convex lens or the diameter of the concave mirror is limited by the thickness of the semiconductor substrate in the range of approximately 400 µm.

However, in optical intersatellite communication and optical space communication, it is necessary to enable communication even with weak optical signals, and to enable communication by receiving optical signals even when the positional relationship between the transmitting side and the receiving side changes, there is a need to further increase the area that receives light (light receiving area). Therefore, as in Patent Document #3, for example, a light receiving device is known in which the distance between the concave mirror and the photodiode is made larger than the cases in Patent Documents #1 and #2 by combining a semiconductor light receiving element and a concave mirror, thereby increasing the light receiving area.

PRIOR ART DOCUMENTS

Patent Documents

Patent Document #1: JP Laid Open Publication No. H05-136446.
Patent Document #2: International Publication No. 2019/150533.
Patent Document #3: JP Laid Open Publication No. 2013-201368.

SUMMARY OF THE INVENTION

Problems to be Solved by the Invention

In Patent Document #3, a semiconductor light receiving element supported by a lead is arranged near the focal point of a concave mirror.
A transparent epoxy resin is filled between the semiconductor light receiving element and the concave mirror, and the semiconductor light receiving element is protected by the epoxy resin. The incident collimated optical signal passes through the epoxy resin and is reflected by the concave mirror so as to be focused toward the semiconductor light receiving element. In this case, a portion of the light incident on the semiconductor light receiving element is reflected by the incident surface of the semiconductor light receiving element, so the incident surface is equipped with an antireflection film made of magnesium fluoride that utilizes light interference.

However, although the difference between the refractive index of the semiconductor light receiving element and the refractive index of the antireflection film is large, the difference between the refractive index of the antireflection film and the refractive index of the epoxy resin is small. Therefore the antireflection effect of this antireflection film is limited, and the reflectance of light incident on the semiconductor light receiving element increases, and the amount of light incident on the photodiode decreases. Furthermore, since the lead blocks the light that enters the concave mirror, the amount of light that enters the photodiode is reduced.

Therefore, an object of the present invention is to provide a light receiving device having a semiconductor light receiving element and a concave mirror configured to suppress a decrease in light incident on a photodiode.

Means to Solve the Problems

The present invention presents a light receiving device having a semiconductor light receiving element in which a photodiode is formed on a main surface side of a first semiconductor substrate, and a concave mirror that reflects incident light toward the semiconductor light receiving element; wherein the concave mirror is provided with a flat first surface of a second semiconductor substrate that is transparent to incident light, a convex surface formed on a second surface opposite to the first surface in a convex shape toward a side opposite to the first surface, and a reflective film formed on the convex surface, and the incident light incident from the first surface is reflected by the reflective film and focused at a condensing position near the first surface, the semiconductor light receiving element is fixed to the first surface of the second semiconductor substrate so as to overlap the light condensing position.

According to the above configuration, in the light receiving device, the semiconductor light receiving element including the photodiode on the main surface side of the first semiconductor substrate focuses the incident light on the condensing position of the concave mirror formed on the second semiconductor substrate that is transparent to incident light. The concave mirror reflects incident light incident from the first surface and focuses the light near the first surface by a reflective film formed on the convex surface of the second surface opposite to the flat first surface of the second semiconductor substrate. Since the light collected by the concave mirror with a large light receiving area can be incident on the photodiode, the area of the photodiode can be reduced for high speed response. Since the semiconductor light receiving element is fixed to the first surface of the second semiconductor substrate, the semiconductor light receiving element can be easily aligned to the condensing position of the concave mirror, and the amount of intercepted incident light can be reduced. Most of the incident light can be made to enter the concave mirror. Therefore, it is possible to suppress a decrease in light incident on the photodiode.

In the light receiving device according to first aspect; a back surface opposite to the main surface of the first semiconductor substrate is fixed in close contact to the first surface of the second semiconductor substrate with an adhesive resin that is transparent to incident light.

According to the above configuration, since the first semiconductor substrate and the second semiconductor substrate are in close contact with each other, the light reflected by the concave mirror is transmitted to the first semiconductor substrate via the second semiconductor substrate without passing through another medium having a lower refractive index than the first semiconductor substrate. When the light enters the first semiconductor substrate from the second substrate, since the difference in refractive index is small, reflection of the light entering the first semiconductor substrate is suppressed, and the light enters the photodiode even without an antireflection film, decrease in light can be suppressed.

In the light receiving device according to second aspect; a back surface facing the main surface of the first semiconductor substrate is fixed to the first surface of the second semiconductor substrate with an adhesive resin that is transparent to incident light and whose thickness is adjusted so that a light reflected by the concave mirror is not reflected.

According to the above configuration, the adhesive resin that is transparent to incident light and whose thickness is adjusted so that the light reflected by the concave mirror is not reflected can function as an antireflection film. Since the adhesive resin reduces the reflection of the light that is reflected by the concave mirror and enters the first semiconductor substrate, it is possible to suppress a decrease in the light that enters the photodiode.

In the light receiving device according to third aspect, the convex surface of the concave mirror is a paraboloid.

According to the above configuration, since the convex surface of the concave mirror is a paraboloid, the reflective film formed on the convex surface allows the collimated light, which is used in optical communication, to be incident as the incident light on the condensing position of the concave mirror, which corresponds to the focal point of the paraboloid. Therefore, the light collected by the concave mirror can be made to enter the photodiode of the semiconductor light receiving element, and it is possible to suppress the reduction in the amount of light that is made to enter the photodiode, which is formed in a small area for high speed response.

In the light receiving device according to fourth aspect, the convex surface of the concave mirror is a partially spherical surface.

According to the above configuration, since the convex surface of the concave mirror is a partially spherical surface, the reflective film formed on this convex surface allows the collimated light used in optical communication to be incident as incident light on the condensing position of the concave mirror which corresponds to the focal point of the partially spherical surface. Therefore, the light collected by the concave mirror can be made to enter the photodiode of the semiconductor light receiving element, and it is possible to suppress the reduction in the amount of light that is made to enter the photodiode, which is formed in a small area for high speed response.

In the light receiving device according to fifth aspect, the first semiconductor substrate is an InP substrate, and the second semiconductor substrate is a Si substrate.

According to the above configuration, the manufacturing cost of the light receiving device can be reduced by forming the small semiconductor light receiving element on the InP substrate and forming the concave mirror with a large light receiving area on the Si substrate which is cheaper than the InP substrate. In addition, since the difference between the refractive index of the InP substrate and the refractive index of the Si substrate is small, it is possible to reduce the reflection of light that enters the semiconductor photodiode from the concave mirror, and it is possible to suppress the decrease in the light that enters the photodiode. Moreover, the InP substrate is transparent to the light used in optical communications, and the incident light passes through the portion other than the photodiode and electrode of semiconductor light receiving element and enters the concave mirror, so it is possible to suppress the decrease in the light incident on the photodiode.

Advantages of the Invention

According to the light receiving device of the present invention, it is possible to suppress a decrease in light incident on the photodiode.

DESCRIPTION OF EMBODIMENTS

Hereinafter, embodiments for implementing the present invention is described based on examples.

First Embodiment

Figure 1:
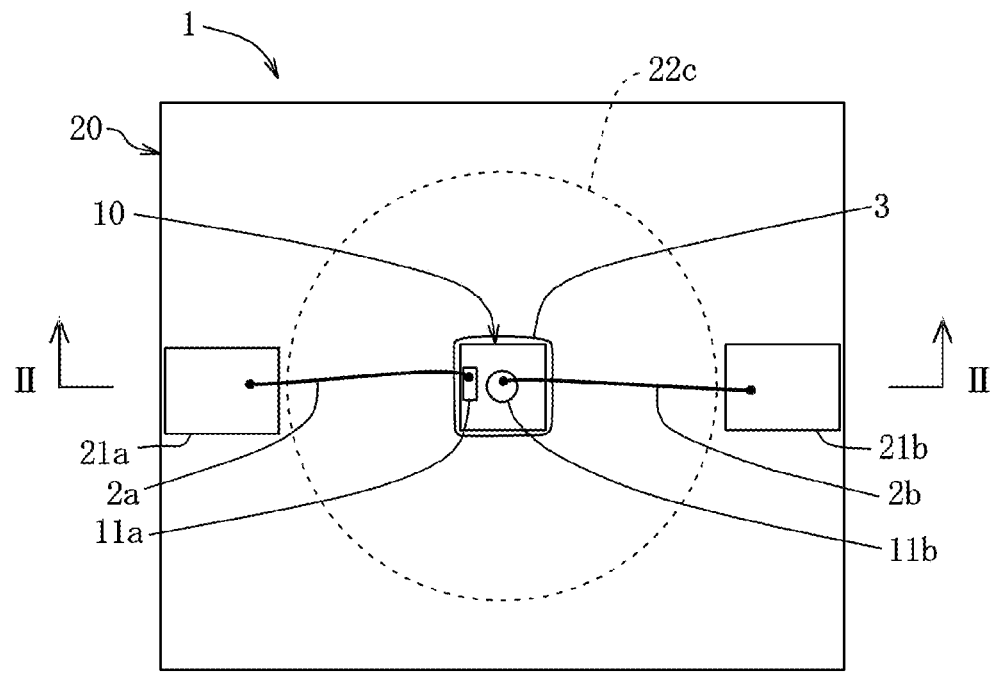
FIG. 1 is a plan view of a light receiving device according to an embodiment of the present invention.
Figure 2:
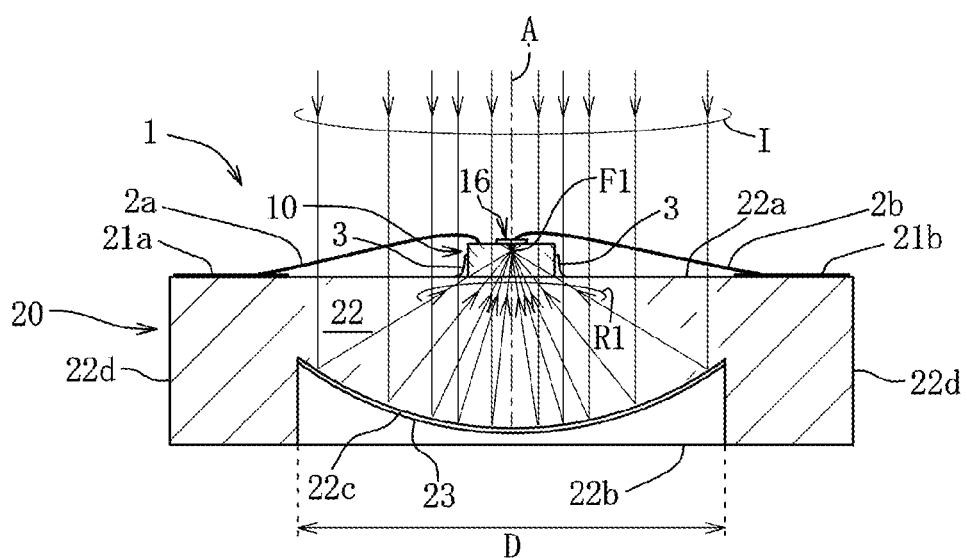
FIG. 2 is a sectional view taken along the line II-II in FIG. 1 showing an example of light incident by a parabolic reflecting surface.

As shown in FIGS. 1 and 2, the light receiving device 1 includes a semiconductor light receiving element 10 and a concave mirror 20.
The semiconductor light receiving element 10 has a pair of electrodes 11a and 11b, and the concave mirror 20 has a pair of output terminal parts 21a and 21b. The pair of electrodes 11a, 11b and the corresponding output terminal parts 21a, 21b are connected by conductive wires 2a, 2b, respectively.

Incident light I, which is a collimated optical signal used in optical communication, is reflected toward the semiconductor light receiving element 10 by the concave mirror 20, and this reflected light R1 is focused on the semiconductor light receiving element 10. When the reflected light R1 enters the semiconductor light receiving element 10, it is converted into a current by photoelectric conversion and output to the outside via the output terminal parts 21a and 21b. Since the electrodes 11a and 11b are connected to the corresponding output terminal parts 21a and 21b by conductive wires 2a and 2b that are thinner than the leads, less of the incident light I that enters the concave mirror 20 is blocked. The incident light I is infrared light with a wavelength in the range of 1300 to 1600 nm, which is generally used for optical communications.

Figure 3:
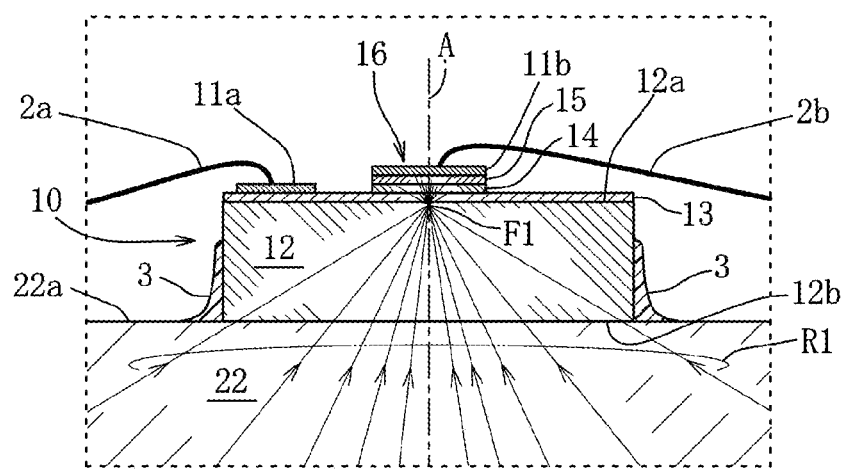
FIG. 3 is an enlarged view of the main part of FIG. 2 showing a semiconductor light receiving element.

As shown in FIG. 3, the semiconductor light receiving element 10 comprises a photodiode 16 formed by laminating, a first semiconductor layer 13, a light absorption layer 14, and a second semiconductor layer 15 on the main surface 12a side of the first semiconductor substrate 12. The semiconductor light receiving element 10 has an electrode 11a connected to the first semiconductor layer 13 of the photodiode 16 and an electrode 11b connected to the second semiconductor layer 15. The first semiconductor substrate 12 is, for example, an InP (indium phosphide) substrate, the first semiconductor layer 13 is, for example, an n-InP layer, the light absorption layer 14 is, for example, an InGaAs layer, and the second semiconductor layer 15 is, for example, a p-InP layer. The InP substrate is transparent to the incident light 1.

The first semiconductor substrate 12 is formed to have a side length of, for example, 500 μm and a thickness of, for example, 150 μm. The photodiode 16 is, for example, a mesa-type photodiode in which the light absorption layer 14 has a diameter of 100 μm, but it may be a planar-type photodiode. The first semiconductor layer 13, the light absorption layer 14, and the second semiconductor layer 15 are each normally set to have a thickness in the range of 1 to 10 μm, and are each formed to have a thickness of 2 μm, for example. The back surface 12b of the first semiconductor substrate 12 facing the main surface 12a is polished, the thickness of the first semiconductor substrate 12 is adjusted, and the back surface 12b is planarized.

As shown in FIG. 2, concave mirror 20 is formed by second semiconductor substrate 22. The second semiconductor substrate 22 has a flat first surface a second surface 22b opposite to the first surface 22a, a convex surface 22c formed in a convex shape formed by recessing a part of the second surface 22b that is formed to be convex to opposite to the first surface 22a, a reflective film 23 formed on this convex surface 22c, and a leg portion 22d around the convex surface 22c. The second semiconductor substrate 22 is, for example, a Si (silicon) substrate with a thickness of 1 mm, and the diameter D of the convex surface 22c is, for example, 2.3 mm. The leg portion 22d is fixed to, for example, a printed circuit board, a base, or the like (not shown). The Si substrate is transparent to incident light I.

On the first surface 22a of the second semiconductor substrate 22, an output terminal 21a and 21b corresponding to the pair of electrodes 11a and 11b of the semiconductor light receiving element 10 is provided via a dielectric film (for example, a silicon oxide film or a silicon nitride film). These output terminal portions 21a and 21b are formed at portions corresponding to the leg portions 22d so as not to overlap the convex surface 22c.

The reflective film 23 is formed by laminating, in order from the convex surface 22c side, a dielectric film such as a silicon oxide film, a metal material such as a Cr (chromium) film and Au (gold) film used also for the electrodes 11a and 11b and the output terminal parts 21a and 21b. For the reflective film 23, metal materials commonly used in semiconductor devices, such as Ti (titanium) and Al (aluminum), can also be used.

The convex surface 22c is a paraboloid, and by forming the reflective film 23 on the convex surface 22c, the convex surface 22c becomes a concave reflective surface toward the first surface 22a side. This convex surface 22c is formed by forming an etching mask on the second surface 22b of the second semiconductor substrate 22, the thickness of which is adjusted so as to have a parabolic shape, using a known method, and using a reactive ion etching method (RIE method) is formed by etching the second semiconductor substrate 22. The convex surface 22c may be formed by grinding with a grindstone or the like formed into a paraboloid shape.

The thickness and paraboloid of the second semiconductor substrate 22 are set such that the focal point of the paraboloid is near and outside the first surface 22a of the second semiconductor substrate 22. Here, the thickness of the second semiconductor substrate 22 is set to 1 mm, and the focal length of the paraboloid is set to 1 mm. Then, the convex surface 22c is recessed from the second surface 22b at a position such that the focus of the paraboloid is on the outside of the second semiconductor substrate 22 and is separated by, for example, 0.1 mm from the first surface 22a.

As shown in FIGS. 2 and 3, the semiconductor light receiving element 10 and the concave mirror 20 are fixed so that the semiconductor light receiving element 10 overlaps the condensing position F1 of the concave mirror 20. In this case, the semiconductor light receiving element 10 is fixed with the central axis A of the photodiode 16 aligned with the axis of symmetry of the convex surface 22c (paraboloid) of the concave mirror 20. For this fixing, an adhesive resin 3 transparent to the incident light I, such as epoxy resin, is used, and the back surface 12b of the first semiconductor substrate 12 is brought into close contact with the first surface 22a of the second semiconductor substrate 22, in this state semiconductor light receiving element 10 and the concave mirror 20 are fixed.

The concave mirror 20 can reflect and condense collimated light parallel to the axis of symmetry of the convex surface 22c, which is incident on the convex surface 22c from the first surface 22a side, toward a focal point F1 corresponding to the focal point of the paraboloid. It is preferable that the first semiconductor substrate 12 of the semiconductor light receiving element 10 overlaps the light focusing position F1 so that the light enters the entire light absorption layer 14 of the photodiode 16. And, it is also preferable that the photodiode 16 overlaps the focal point F1. Since the diameter D of the convex surface 22c is large, it is possible to tolerate a certain degree of radial deviation of the optical axis of the incident light I with respect to the axis of symmetry. For example, in optical space communication, even if the positional relationship of the transmitting side and the receiving side changes, it becomes difficult to interrupt the optical communication. Further, even when low intensity collimated light is incident, the light is collected by the concave mirror 20 with a large light receiving area, so the light receiving sensitivity is improved.

The adhesive resin 3 is applied along the outer periphery of the semiconductor light receiving element 10 that is brought into close contact with the first surface 22a of the second semiconductor substrate 22 of the concave mirror 20, and as the adhesive resin 3 hardens, the semiconductor light receiving element 10 and the concave mirror 20 are bonded together. Since the back surface 12b of the first semiconductor substrate 12 and the first surface 22a of the second semiconductor substrate 22 are flat, the back surface 12b and the first surface 22a can be brought into close contact with each other without any gap.

Generally, when light is incident on media having different refractive indexes, a portion of the light is reflected at the interface, and the greater the difference in refractive index at the interface, the greater the reflectance tends to be. When the refractive index of air is 1, the difference between the refractive index of the first semiconductor substrate 12 (3.2 in the case of an InP substrate) and the refractive index of the second semiconductor substrate 22 (3.5 in the case of a Si substrate) is smaller than the difference between the refractive index of the first and second semiconductor substrates 12 and 22 and the refractive index of air. Further, the difference between the refractive index of the first semiconductor substrate 12 and the refractive index of the second semiconductor substrate 22 is smaller than the difference between the refractive index of the first and second semiconductor substrates 12, 22 and the refractive index of the adhesive resin 3 (in the case of epoxy resin, it is usually approximately 1.5). Since the difference in refractive index between the first semiconductor substrate 12 and the second semiconductor substrate 22 is small, the reflected light R1 reflected by the concave reflective surface of the concave mirror 20 enters the first semiconductor substrate 12 from the second semiconductor substrate 22 can be reduced.

Figure 4:
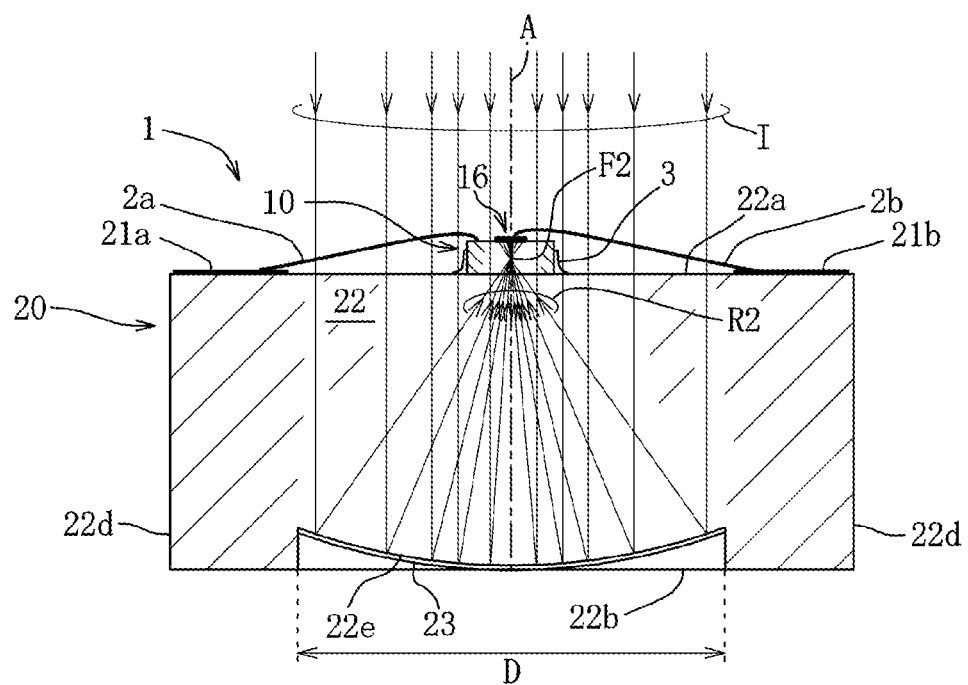
FIG. 4 is a cross sectional view showing an example of light incident on a partially spherical reflecting surface.

As shown in FIG. 4, the concave reflective surface of the concave mirror 20 can be formed by forming the reflective film 23 on the partially spherical convex surface 22e instead of the parabolic convex surface 22c. The thickness and partial spherical surface of the second semiconductor substrate 22 are respectively set so that the focal point of the partial spherical surface is outside the second semiconductor substrate 22 and near the first surface 22a of the second semiconductor substrate 22. Here, the thickness of the second semiconductor substrate 22 is set to 1.6 mm, and a part of the spherical surface (partial spherical surface) with a radius of 3.4 mm is a convex surface 22e.

The focal point of this partial spherical surface (convex surface 22e) is on the outside of the second semiconductor substrate 22 and is located at a distance of 0.1 mm from the first surface 22a. The semiconductor light receiving element 10 and the concave mirror 20 are fixed with adhesive resin 3 so that the semiconductor light receiving element 10 overlaps the condensing position F2 of the concave mirror 20 corresponding to this focal point. The semiconductor light receiving element 10 is configured such that the central axis A of the photodiode 16 coincides with the symmetry axis of the convex surface 22e, and the back surface 12b of the first semiconductor substrate 12 is in close contact with the first surface 22a of the second semiconductor substrate 22. In this state, it is fixed to the concave mirror 20.

Reflected light R2, which is generated by the incident light I parallel to the axis of symmetry of the convex surface 22e reflected by the concave reflecting surface, is focused toward the focusing position F2 and enters the semiconductor light receiving element 10. The diameter D of the convex surface 22e is, for example, 2.3 mm, and since the diameter D of the convex surface 22e is large, it is possible to tolerate a certain degree of radial deviation of the optical axis of the incident light I with respect to the axis of symmetry. When the positional relationship between the transmitting side and the receiving side changes, communication becomes less likely to be interrupted. Further, even when low intensity collimated light is incident, the light is collected by the concave mirror 20 with a large light receiving area, so the light receiving sensitivity is improved.

Figure 5:
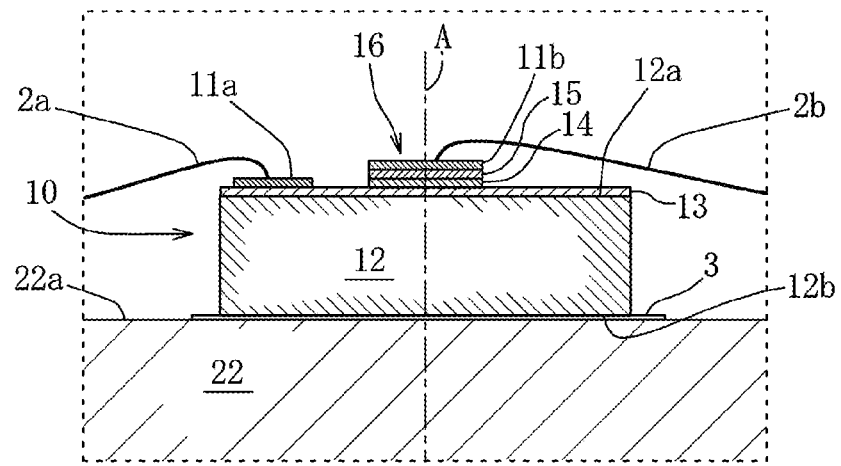
FIG. 5 is an enlarged view of main parts showing another example of how the semiconductor light receiving element and the concave mirror are fixed.

As shown in FIG. 5, the first surface 22a of the second semiconductor substrate 22 of the concave mirror 20 and the back surface 12b of the first semiconductor substrate 12 of the semiconductor light receiving element 10 are bonded using adhesive resin 3 that is transparent to the incident light I. In this case, the thickness of the adhesive resin 3 is adjusted to a thickness that makes it difficult for light reflected by the concave reflective surface to be reflected.

Figure 6:
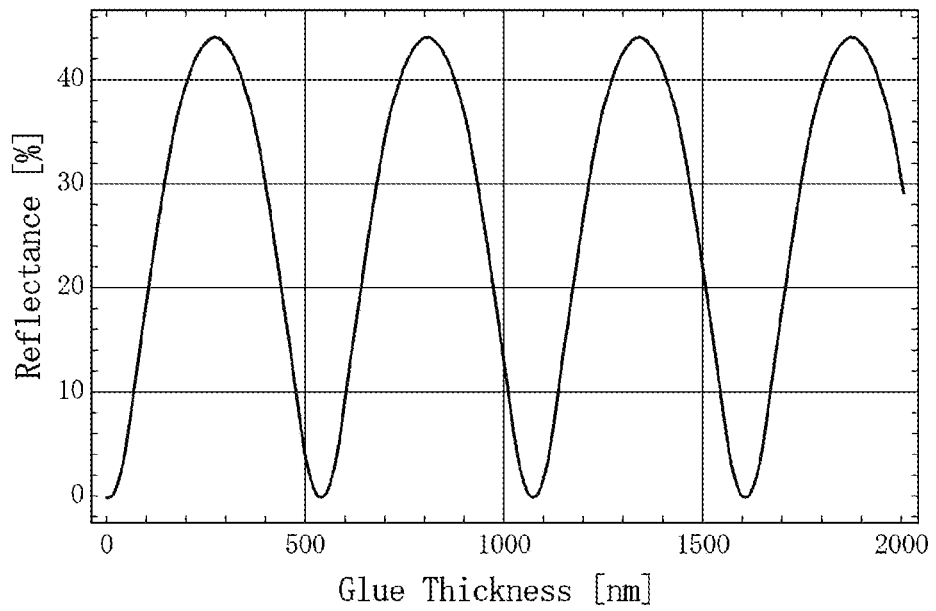
FIG. 6 is a graph showing calculation results of the relationship between the thickness of the adhesive resin and the reflectance of light incident on the semiconductor light receiving element.

As shown in FIG. 6, for example, the reflectance of light incident on the first semiconductor substrate 12 from the second semiconductor substrate 22 changes periodically with respect to the thickness of the adhesive resin 3 whose refractive index is 1.45. The reflectance is lowest when the thickness of the adhesive resin 3 is 0, 540, 1080, or 1620 nm, so the semiconductor photodetector 10 and the concave mirror 20 are bonded by the adhesive resin 3 adjusted to a thickness that reduces the reflectance (for example, 540 nm). Note that the reflectance is calculated to be 14.4% when the space between the reflective film 23 and the semiconductor light receiving element 10 is filled with epoxy resin, and 27% when it is filled with air.

The adhesive resin 3 whose thickness is adjusted to have a low reflectance functions as an anti-reflection film that utilizes light interference, and can suppress reflection when light enters the first semiconductor substrate 12 from the second semiconductor substrate 22. Therefore, most of the light reflected by the concave mirror 20 can be made to enter the semiconductor light receiving element 10.

The functions and effects of the light receiving device 1 described above will be explained.

In the light receiving device 1, a semiconductor light receiving element 10 including a photodiode 16 on the main surface 12a side of a first semiconductor substrate 12 is fixedly mounted on a concave mirror 20 formed by a second semiconductor substrate 22 that is transparent to incident light I, so as to overlap the light focusing positions F1 and F2. The concave mirror 20 reflects the incident light I entering from the first surface 22a side by means of a reflective film 23 formed on the convex surfaces 22c and 22e on the second surface 22b side opposite to the flat first surface 22a of the second semiconductor substrate 22. The light is reflected and focused at focusing positions F1 and F2 near the first surface 22a.

Since the reflected light collected by the concave mirror 20 having a large light receiving area can be incident on the photodiode 16, the area of the photodiode 16 can be reduced for high speed response. Since the semiconductor light receiving element 10 is fixed to the first surface 22a of the second semiconductor substrate 22 of the concave mirror 20 without using a lead, it can be easily aligned with the condensing positions F1 and F2 of the concave mirror 20. At the same time, the intercepted incident light 1 can be reduced and most of the incident light I can be made to enter the concave mirror 20. Therefore, a decrease in light incident on the photodiode 16 can be suppressed.

The semiconductor light receiving element 10 and the concave mirror 20 are fixed by an adhesive resin 3 that is transparent to the incident light I so that the back surface 12b of the first semiconductor substrate 12 and the first surface 22a of the second semiconductor substrate 22 are in close contact with each other. Since the first semiconductor substrate 12 and the second semiconductor substrate 22 are in close contact with each other, the reflected lights R1 and R2 reflected by the concave mirror 20 are transmitted to the first semiconductor substrate 12 from the second semiconductor substrate without passing through another medium having a lower refractive index than the first semiconductor substrate 12. The light enters the first semiconductor substrate 12 from the second semiconductor substrate 22. Since the difference in refractive index is small when the light enters the first semiconductor substrate 12 from the second semiconductor substrate 22, reflection of the light entering the first semiconductor substrate 12 is suppressed, and even without an antireflection film, the photodiode 16 can be suppressed from decreasing.

The adhesive resin 3 is transparent to the incident light I and whose thickness is adjusted so that the reflected lights R1 and R2 reflected by the concave mirror 20 are not reflected. By using the adhesive resin 3, the back surface 12b of the substrate 12 and the first surface 22a of the second semiconductor substrate 22 of the concave mirror 20 may be bonded and fixed. By allowing the adhesive resin 3 to function as an antireflection film, the reflection of light that is reflected by the concave mirror 20 and enters the first semiconductor substrate 12 is reduced, and a decrease in the light that enters the photodiode 16 can be suppressed.

When the concave mirror 20 has a convex surface 22c that is a paraboloid, the collimated light used in optical communication as the incident light I that enters the concave mirror 20 is focused at the condensing position F1 of the concave mirror 20, which corresponds to the focal point of the paraboloid. Therefore, the reflected light R1 received by the concave mirror 20 with a large light receiving area can be incident on the photodiode 16, thereby suppressing reducing of the amount of light incident on the photodiode 16, which is formed in a small area for high speed response.

When the concave mirror 20 has a convex surface 22e that is a partially spherical surface, the collimated light used in optical communication as the incident light I that enters the concave mirror 20 is focused at the condensing position F2 of the concave mirror 20, which corresponds to the focal point of the partially spherical surface. Therefore, the reflected light R2 received by the concave mirror 20 with a large light receiving area can be incident on the photodiode 16, and reducing g of the amount of light incident on the photodiode 16, which is formed in a small area for high speed response can be suppressed.

The first semiconductor substrate 12 is an InP substrate, and the second semiconductor substrate 22 is a Si substrate. The manufacturing cost of the light receiving device I can be reduced by forming the small semiconductor light receiving element 10 on an InP substrate and forming the concave mirror 20 with a large light receiving area on a Si substrate which is cheaper than the InP substrate. Furthermore, since the difference between the refractive index of the InP substrate and the refractive index of the Si substrate is small, it is possible to reduce the reflection of the reflected lights R1 and R2 when they enter the semiconductor light receiving element 10, and reducing of the light that enters the photodiode 16 can be suppressed. Furthermore, the InP substrate is transparent to the light used in optical communication, and the incident light I passes through the portions other than the photodiode 16 and electrodes 11a and 11b of the semiconductor light receiving element 10 and enters the concave mirror 20, it is possible to suppress a decrease in light incident on the photodiode 16.

An anti-reflection film is formed on the first surface 22a of the second semiconductor substrate 22 in areas other than the area where the semiconductor light receiving element 10 is fixed, so as to reduce the reflection of the incident light I that enters from the first surface 22a side. In addition, those skilled in the art can implement various modifications to the embodiments described above without departing from the spirit of the present invention, and the present invention includes such modifications.

The invention claimed is:

1. A light receiving device having a semiconductor light receiving element in which a photodiode is formed on a main surface side of a first semiconductor substrate, and a concave mirror that reflects incident light toward the semiconductor light receiving element; wherein the concave mirror is provided with a flat first surface of a second semiconductor substrate that is transparent to incident light, a convex surface formed on a second surface opposite to the first surface in a convex shape toward a side opposite to the first surface, and a reflective film formed on the convex surface, and the incident light incident from the first surface is reflected by the reflective film and focused at a condensing position near the first surface, the semiconductor light receiving element is fixed to the first surface of the second semiconductor substrate so as to overlap the light condensing position, wherein a back surface facing the main surface of the first semiconductor substrate is fixed to the first surface of the second semiconductor substrate with an adhesive resin that is transparent to incident light and a thickness of the adhesive resin is adjusted to suppress reflection of light reflected by the concave mirror when the light enters the first semiconductor substrate from the second semiconductor substrate by utilizing light interference.

2. The light receiving device according to claim 1, wherein the convex surface of the concave mirror is a paraboloid.

3. The light receiving device according to claim 1, wherein the convex surface of the concave mirror is a partially spherical surface.

4. The light receiving device according to claim 1, wherein the first semiconductor substrate is an InP substrate, and the second semiconductor substrate is a Si substrate.

\* \* \* \* \*